(12) United States Patent
Chin et al.

(10) Patent No.: US 10,771,663 B2
(45) Date of Patent: Sep. 8, 2020

(54) PRESSURE PIVOTING ELECTRONIC MIRRORING DEVICE

(71) Applicant: CAL-COMP BIG DATA, INC., New Taipei (TW)

(72) Inventors: Tzu-Wen Chin, New Taipei (TW); Teng-Nan Lo, New Taipei (TW)

(73) Assignee: CAL-COMP BIG DATA, INC., New Taipei (TW)

( * ) Notice: Subject to any disclaimer, the term of this patent is extended or adjusted under 35 U.S.C. 154(b) by 0 days.

(21) Appl. No.: 16/432,781

(22) Filed: Jun. 5, 2019

(65) Prior Publication Data
US 2020/0228690 A1 Jul. 16, 2020

(30) Foreign Application Priority Data
Jan. 11, 2019 (CN) .......................... 2019 1 0028046

(51) Int. Cl.
*H04N 5/225* (2006.01)
*F16M 11/10* (2006.01)
(Continued)

(52) U.S. Cl.
CPC ......... *H04N 5/22525* (2018.08); *A45D 42/16* (2013.01); *A47G 1/02* (2013.01);
(Continued)

(58) Field of Classification Search
CPC .... H04N 5/22525; H04N 5/64; F16M 11/105; F16M 11/125; H05K 5/0017;
(Continued)

(56) References Cited

U.S. PATENT DOCUMENTS

| 6,189,842 B1 * | 2/2001 | Bergeron Gull ..... F16M 11/105 248/125.1 |
| 6,822,857 B2 * | 11/2004 | Jung ...................... F16M 11/10 248/920 |

(Continued)

FOREIGN PATENT DOCUMENTS

| EP | 1793303 A2 | 6/2007 |
| WO | 2006095987 A1 | 9/2006 |

OTHER PUBLICATIONS

Search Report dated Dec. 12, 2019 of the corresponding European patent application.

*Primary Examiner* — Lin Ye
*Assistant Examiner* — Chriss S Yoder, III
(74) *Attorney, Agent, or Firm* — Chun-Ming Shih; HDLS IPR Services (57) ABSTRACT

A pressure pivoting electronic mirroring device has a supporting unit a mirroring display panel and a pressure hinge assembly. The mirroring display panel is connected with the supporting unit via a cable. The pressure hinge assembly has a pivoting seat arranged on a back surface of the mirroring display panel, a supporting portion in the mirroring display panel, a fastener attached on the supporting portion and a pivoting portion pivoted with the pivoting seat and arranged protruding on the back surface of the mirroring display panel to connected to the supporting unit, and a cabling space allowing the cable to inset therethrough is defined in the pivoting portion. The fastener is fastened on the supporting portion when the pivoting portion and the pivoting seat are relatively pivoted.

12 Claims, 8 Drawing Sheets

(51) Int. Cl.

| | | |
|---|---|---|
| *F16M 11/12* | (2006.01) | |
| *A45D 42/16* | (2006.01) | |
| *A47G 1/02* | (2006.01) | |
| *H05K 5/00* | (2006.01) | |
| *H05K 5/02* | (2006.01) | |

(52) U.S. Cl.
CPC ......... *F16M 11/105* (2013.01); *F16M 11/125* (2013.01); *H05K 5/0017* (2013.01); *H05K 5/0226* (2013.01); *H05K 5/0247* (2013.01)

(58) Field of Classification Search
CPC .... H05K 5/0226; H05K 5/0247; A45D 42/16; A47G 1/02; G06F 1/1601; G06F 1/1605; G06F 1/1637; G06F 2200/1612; B60R 11/0235; B60R 2011/0087
See application file for complete search history.

(56) References Cited

U.S. PATENT DOCUMENTS

| | | | |
|---|---|---|---|
| 7,424,994 B2* | 9/2008 | Jeong | F16M 11/105 |
| | | | 248/276.1 |
| 9,269,157 B2* | 2/2016 | Saban | G02B 5/08 |
| 10,440,319 B2* | 10/2019 | Han | A61B 5/6801 |
| 2002/0196333 A1* | 12/2002 | Gorischek | A45D 44/005 |
| | | | 348/61 |
| 2007/0127197 A1* | 6/2007 | Tae | G06F 1/1626 |
| | | | 361/679.27 |
| 2008/0225123 A1 | 9/2008 | Osann et al. | |
| 2017/0051865 A1* | 2/2017 | Chen | F16M 11/041 |

\* cited by examiner

PRESSURE PIVOTING ELECTRONIC MIRRORING DEVICE

BACKGROUND OF THE INVENTION

1. Technical Field

The present disclosure is related to an electronic device, and in particular to a pressure pivoting electronic mirroring device.

2. Description of Related Art

A conventional mirror is arranged on a wall or placed on a table, such as a table mirror. Mostly, a conventional table mirror is arranged at a fixed inclination. Alternatively, a hinge could be arranged on the mirror for adjusting an inclination of the table mirror, however, the conventional mirror is neither rotatable nor adjustable. Therefore, the conventional mirror is unadjusted for portrait screen or landscape screen.

Moreover, as 3C industries are rapidly developed, a display is combined with a camera to be an electronic mirror device or a smart mirror. Namely, an image of a user is photographed by the camera and the image and/or related data are further present on the display by displaying or mirroring. According to various requirements, the electronic mirror device could optically mirror the image of the user as the conventional mirror. Alternatively, the electronic mirror device could electronically present the image of the user photographed by the camera on a built-in display module (such as an LCD display), and the electronic mirror device achieves a same function as a conventional mirror. Further various electronic and data functions could be presented by the display module of the electronic mirror device. Additional functions compared with the conventional mirror might be developed by technological industry and presented on the smart mirror. The smart mirror should be arranged as a portrait screen or a landscape screen according to various requirements of user(s). However, the conventional mirror cannot perform the aforementioned functions.

In views of this, in order to solve the above disadvantage, the present inventor studied related technology and provided a reasonable and effective solution in the present disclosure.

SUMMARY OF THE INVENTION

A pressure pivoting electronic mirroring device is provided in the present disclosure. The pressure pivoting electronic mirroring device is namely a pivotal connecting structure providing a pressure, and thereby could be arranged as a portrait screen or a landscape screen according to the user's requirement. The pressure pivoting electronic mirroring device could be position at any inclination.

Accordingly, a pressure pivoting electronic mirroring device having a supporting unit a mirroring display panel and a pressure hinge assembly is provided in the present disclosure. The mirroring display panel is connected with the supporting unit via a cable. The pressure hinge assembly has a pivoting seat arranged on a back surface of the mirroring display panel, a supporting portion in the mirroring display panel, a fastener attached on the supporting portion and a pivoting portion pivoted with the pivoting seat and arranged protruding on the back surface of the mirroring display panel to connected to the supporting unit, and a cabling space allowing the cable to inset therethrough is defined in the pivoting portion. The fastener is fastened on the supporting portion when the pivoting portion and the pivoting seat are relatively pivoted.

BRIEF DESCRIPTION OF DRAWING

The present disclosure can be more fully understood by reading the following detailed description of the embodiment, with reference made to the accompanying draw.

DETAILED DESCRIPTION OF THE INVENTION

Detail descriptions and technical contents of the present disclosure are described below with drawings. However, the drawings are provided for reference and demonstration, and the present disclosure should not be limited by the drawings.

Accordingly, additional functions compared with the conventional mirror might be developed by technological industry and presented on the smart mirror. For example, a picture-in-picture could be presented on the aforementioned smart mirror, namely at least one sub screen (or picture-of-picture) could be presented on the mirror for video playing or makeup teaching when the user is using the mirror. Meanwhile, the user might selectively use the mirror as a portrait screen or a landscape screen according to the using circumstance, and thereby putting the sub screen at a position convenient for watching. However, the conventional mirrors or smart mirrors do not have the aforementioned functions. Furthermore, electronic components such as display modules are accommodated in the smart mirror, and the smart mirror is therefore heavy, and even an adjustable conventional smart mirror cannot be arranged as a portrait screen or a landscape screen. The present disclosure can effectively improve the above-mentioned deficiencies.

Figure 1:
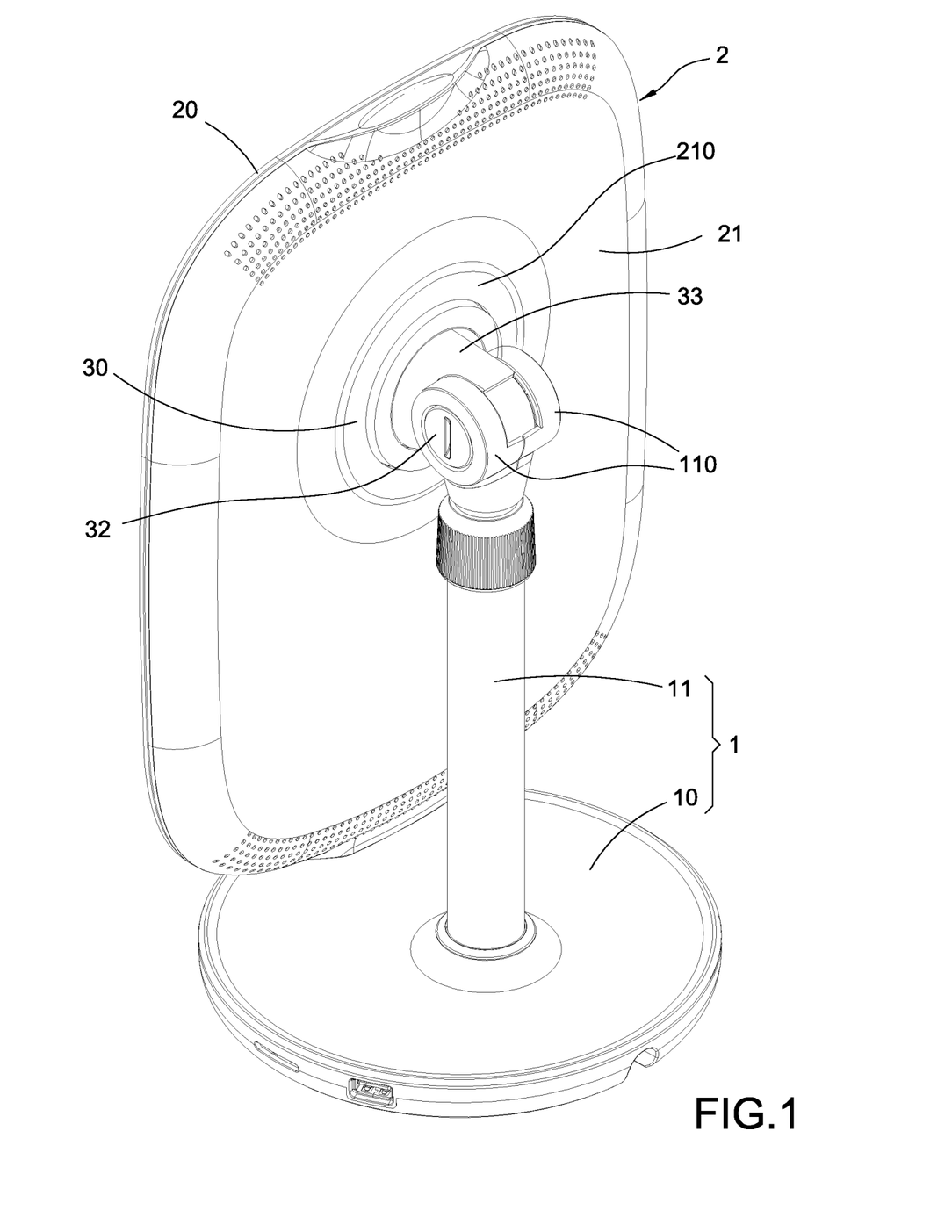
FIG. 1 is a perspective view showing the present disclosure.

According to FIG. 1, a perspective view showing the present disclosure, a pressure pivoting electronic mirroring device having a supporting unit 1, a mirroring display panel 2 and a pressure hinge assembly 3 is provided in the present disclosure. The supporting unit 1 is used for supporting the mirroring display panel 2 on a table to present the mirror in front of a user. The pressure hinge assembly 3 is connected between the supporting unit 1 and the mirroring display panel 2 so that the mirroring display panel 2 could be arranged as a portrait screen or a landscape screen according to convenience of the user.

Accordingly, the supporting unit 1 mainly has a base 10 and a supporting rod 11 arranged upright on the base 10. A lower end of the supporting rod 11 is fixed on the base 10 and an upper end thereof is pivoted with the aforementioned pressure hinge assembly 3. According to the embodiment of the present disclosure, a pivoting shaft 110 could be further arranged on the upper end of the supporting rod 11. The mirroring display panel 2 is pivoted with the pressure hinge assembly 3 via the pivoting shaft 110 and an inclination thereof is thereby adjustable.

Figure 2:
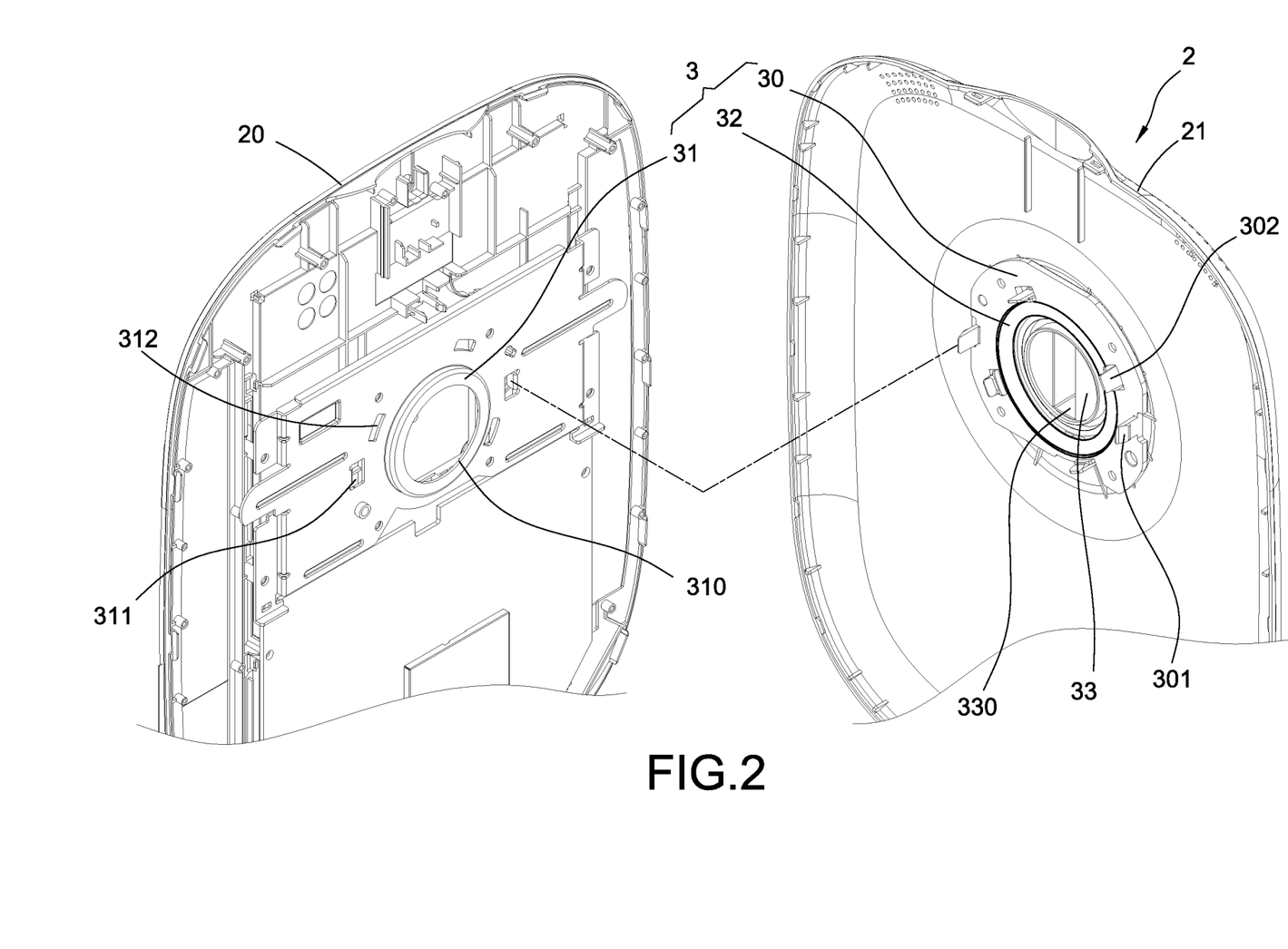
FIG. 2 is an exploded view showing the pressure hinge assembly arranged in the mirroring display panel of the present disclosure.

Further according to FIG. 2, the mirroring display panel 2 has a displaying surface 20 and a back surface 21 opposite to the displaying surface 20. An image of the user photographed by a camera (not shown in Figs.) could be presented on the displaying surface 20. At least a part of the displaying surface 20 is a light transmissive glass or a glass coated with a transparent conductive film (not shown in Figures), for example, glass coated with Indium Tin Oxide (ITO). The image of the user is mirrored on the displaying surface 20. A displaying module (not shown in Figures) could be arranged in the mirroring display panel 2 and the image of the user photographed by the camera could be presented by displaying on the displaying surface 20.

Figure 3:
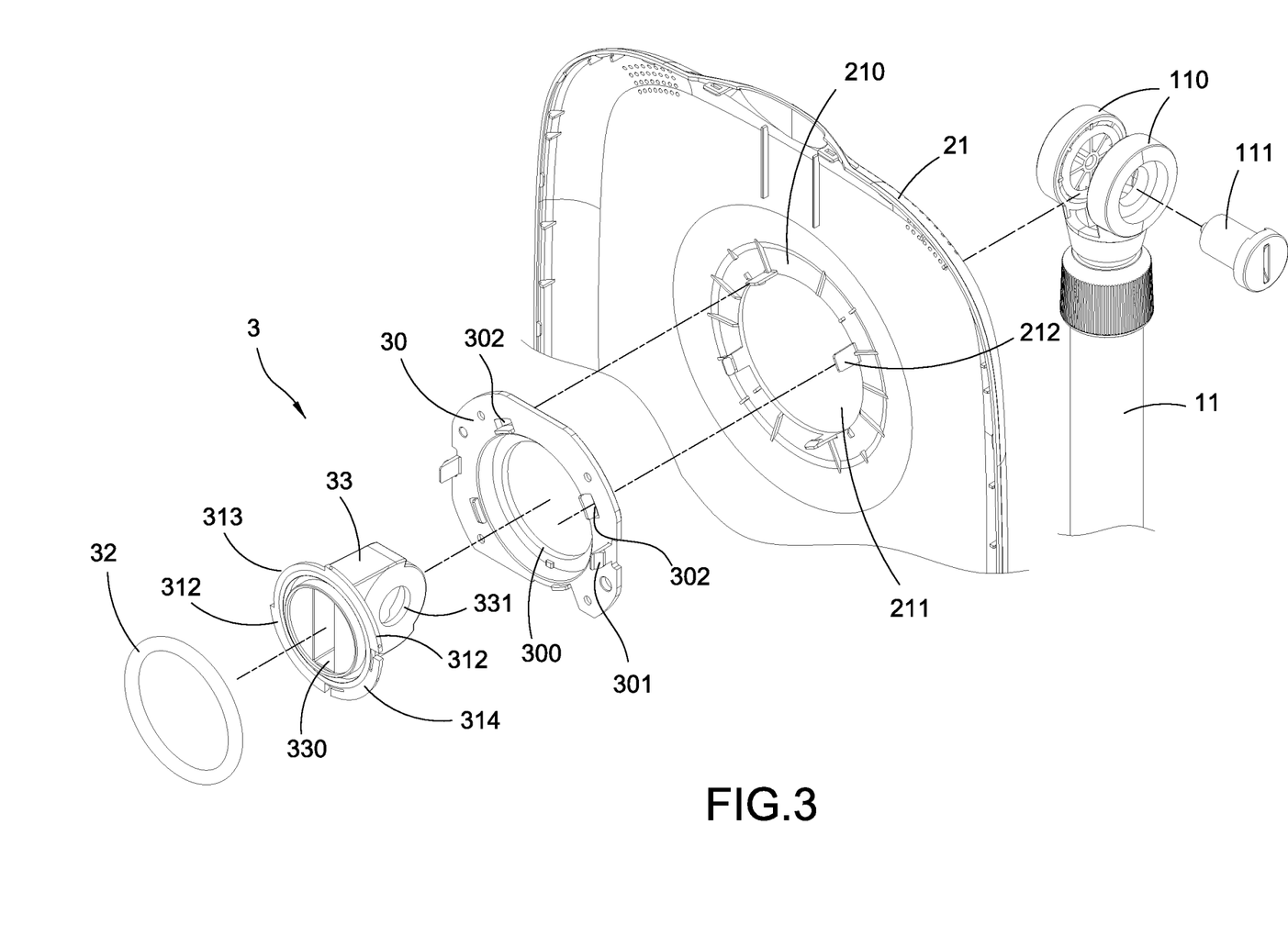
FIG. 3 is an exploded view showing the pressure hinge assembly, the back surface of the mirroring display panel and the supporting unit according to the present disclosure.
Figure 4:
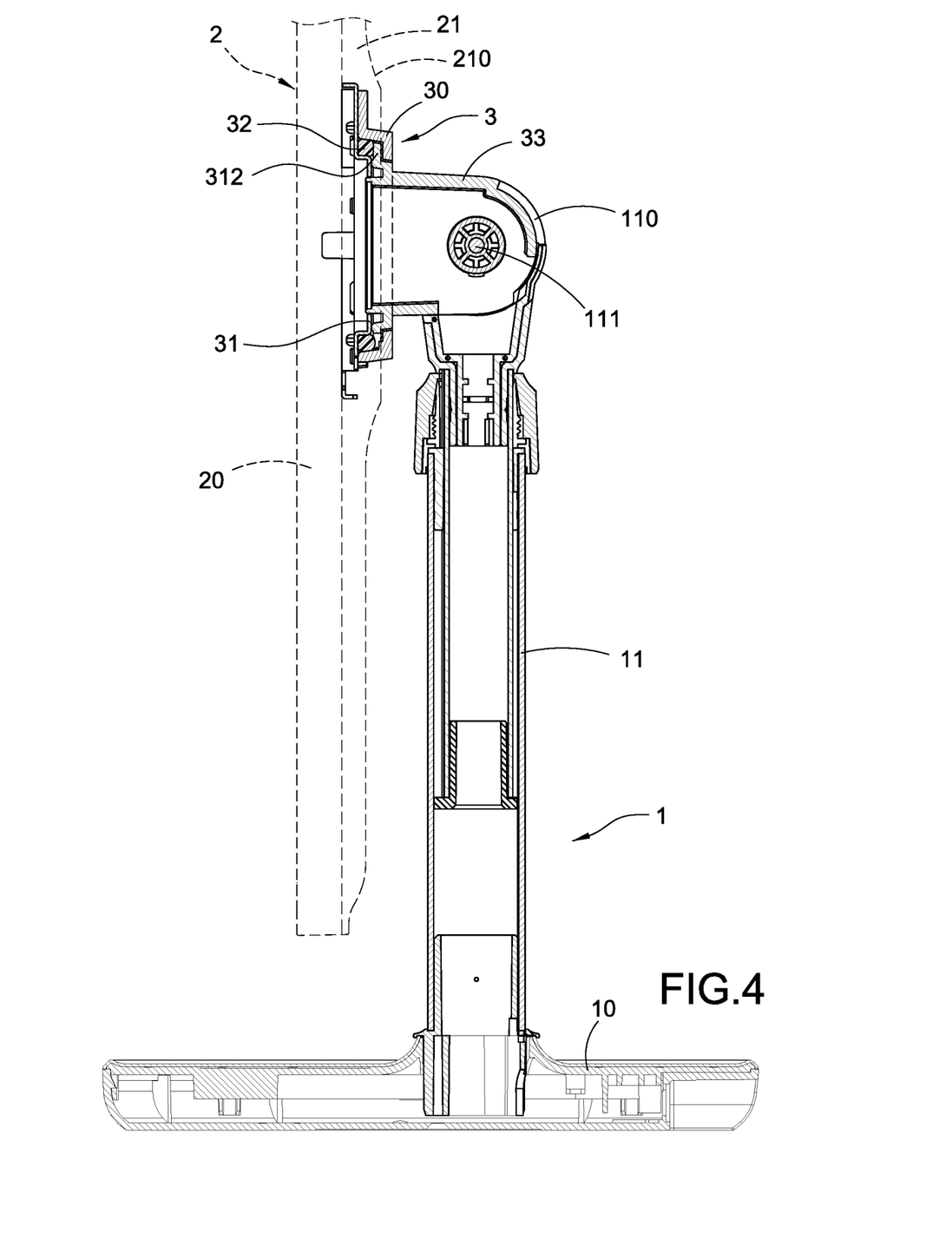
FIG. 4 is a cross sectional view showing a part of the inner structure of the present disclosure.

Further according to FIGS. 2 to 4, the pressure hinge assembly 3 has a pivoting seat 30 arranged on the back surface 21 of the aforementioned mirroring display panel 2, a supporting portion 31 in the mirroring display panel 2, a fastener 32 attached on the supporting portion 31 and a pivoting portion 33 pivoted with the pivoting seat 30. The pivoting portion 33 is arranged protruding penetrating the back surface 21 from inside of the mirroring display panel 2 to connect to the supporting unit 1. The supporting unit 1 and the mirroring display panel 2 are connected by pivoting the pivoting seat 30 with the pivoting portion 33. Thereby, the mirroring display panel 2 could be arranged as a portrait screen or a landscape screen according to convenience of the user. The fastener 32 is an elastic member such as a rubber ring. The fastener 32 is pressed by the pivoting portion 33 and thereby attached on the supporting portion 31. The fastener 32 is used for adjusting a pressure provided by the pressure hinge assembly 3 to position the aforementioned mirroring display panel 2 when the mirroring display panel 2 is arranged as a portrait screen or a landscape screen.

Further according to FIGS. 3 and 4, a cabling space 330 communicated with the aforementioned mirroring display panel 2 is defined in the pivoting portion 33. A cable 22 is thereby allowed to extend from inside of the mirroring display panel 2 to inside of the supporting rod 11 of the supporting unit 1 through the cabling space 330 and further electrically connected to a circuit board (not shown) in the base 10 Specifically, according to FIG. 2, a cabling hole 310 could be defined on the supporting portion 31 and the cable 22 is thereby allowed to extend out of the displaying surface 20 from inside of the displaying surface 20. A fixing portion 210 for positioning the pivoting seat 30 assembled thereinto could be formed on the back surface 21 of the mirroring display panel 2. A through hole 211 is defined on the fixing portion 210 and a pivoting hole 300 is defined on the pivoting seat 30. The pivoting portion 33 is pivoted into the pivoting hole 300 and further protruding from the fixing portion 210 through the through hole 211. Moreover, handling arms 301 snapped on the handling ring 311 of the supporting portion 31 could be arranged on the pivoting seat 30, and fixing holes 302 could be defined thereon for fixing the fixing piece 212 arranged on the back surface 21 of the mirroring display panel 2 in the back surface 21.

Furthermore, the aforementioned pivoting seat 30 could be one piece formed on the back surface 21 of the mirroring display panel 2. The supporting portion 31 of the pressure hinge assembly 3 could be an element or a part in the mirroring display panel 2, and the supporting portion 31 only used for resisting a fastening force pressing on the pressure hinge assembly 3 from the mirroring display panel 2 assembled therewith. Thereby, the pivoting portion 33 of the pressure hinge assembly 3 is disposed protruding on the back surface 21 of the mirroring display panel 2 and connected to the pivoting shaft 110 of the supporting unit 1. Moreover, an axial hole 331 could be defined on the pivoting portion 33 for pivoting with the pivoting shaft 110 of the supporting unit 1 and an inclination between the pressure hinge assembly 3 and the supporting unit 1 is thereby adjustable.

Figure 5:
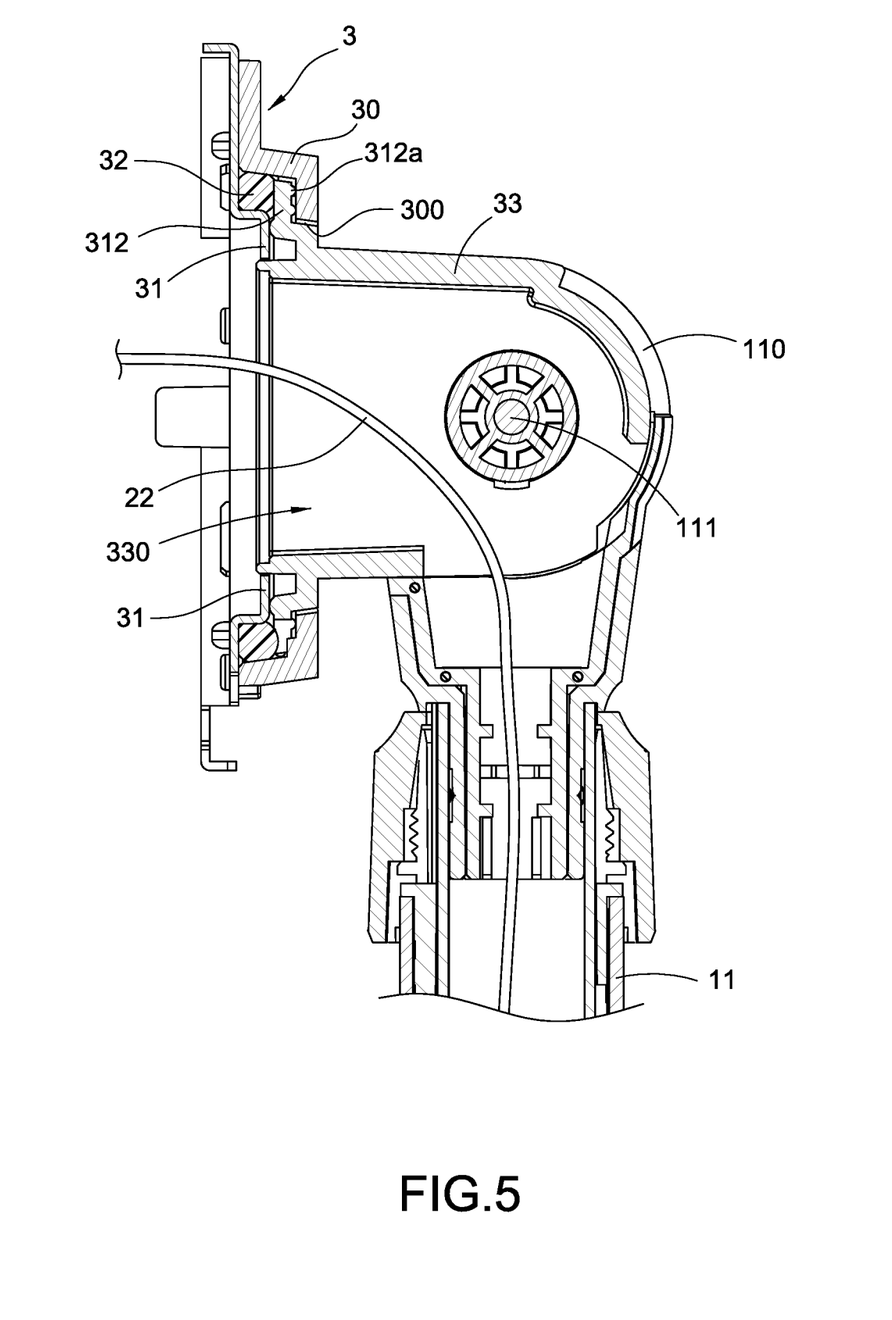
FIG. 5 is a cross sectional view showing the pressure hinge assembly according to the present disclosure.
Figure 6:
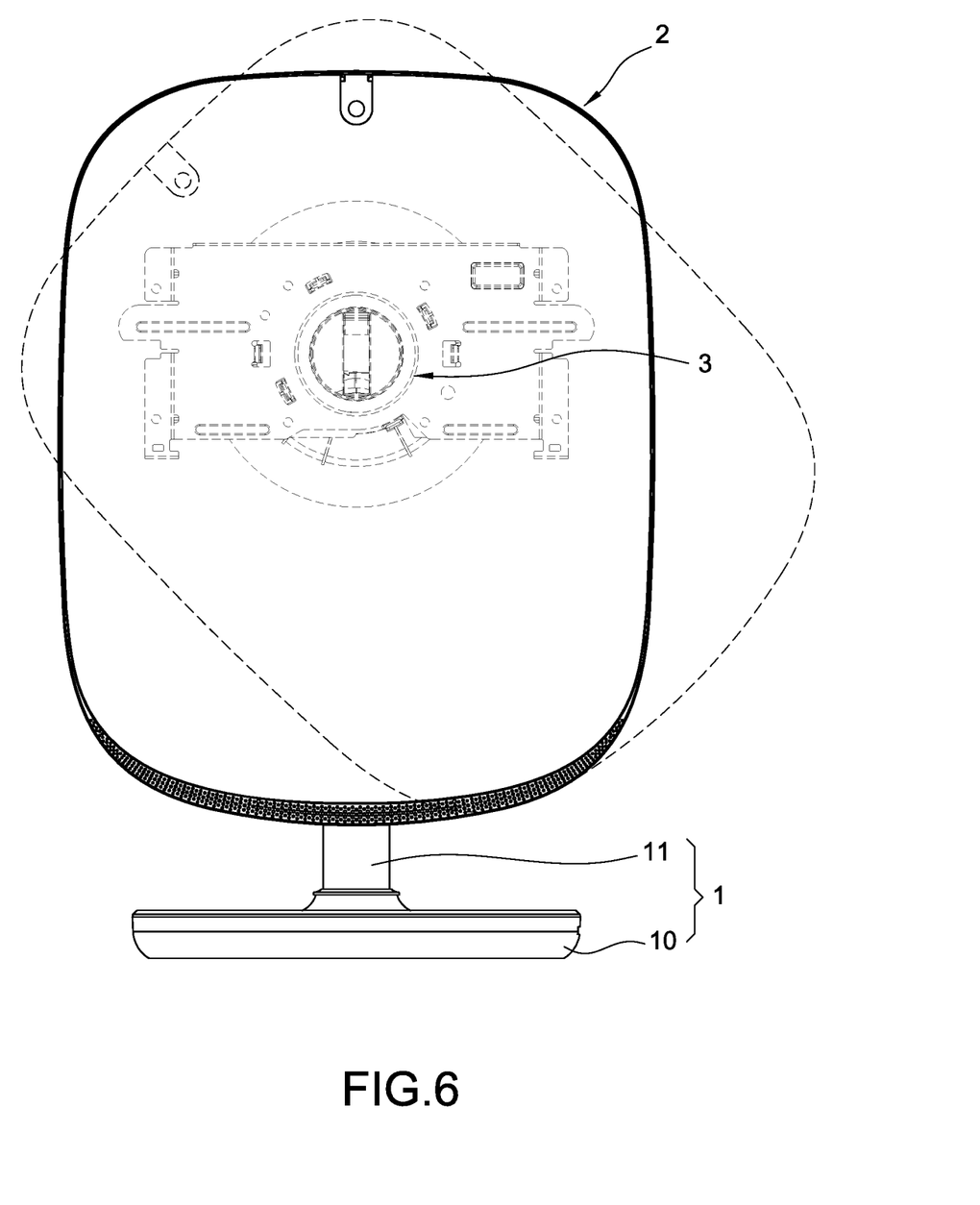
FIG. 6 is a schematic view showing the rotation motion according to the present disclosure.

According to FIG. 6, the aforementioned mirroring display panel 2 could be arranged as a portrait screen or a landscape screen by the pressure hinge assembly 3 of the present disclosure and could be position at any inclination. According to FIG. 7, at least two limiting rings 312 are arranged on a peripheral edge of the pivoting portion 33 of the pressure hinge assembly 3. Protruding structure(s) 312a (shown in FIG. 5) could be arranged on another portion of each of the two limiting rings 312 corresponding to the pivoting seat 30 for fastening the pivoting seat 30. Each of the two limiting rings 312 is notched on a peripheral edge thereof to form a moving area 313. A limiting block 303 is arranged on the pivoting seat 30 and located in the moving area 313, and the pivoting seat 30 and the pivoting portion 33 are thereby relatively pivotable. Specifically, an end of the moving area 313 is a first end 313a, and the other end of the moving area 313 is a second end 313b. When the mirroring display panel 2 is arranged as a portrait screen or a landscape screen according to FIG. 8, the limiting block 303 is moved in an angular rage on the peripheral edge defined by the moving area 313, and the mirroring display panel 2 thereby could be adjusted to be a portrait screen or a landscape screen.

Figure 7:
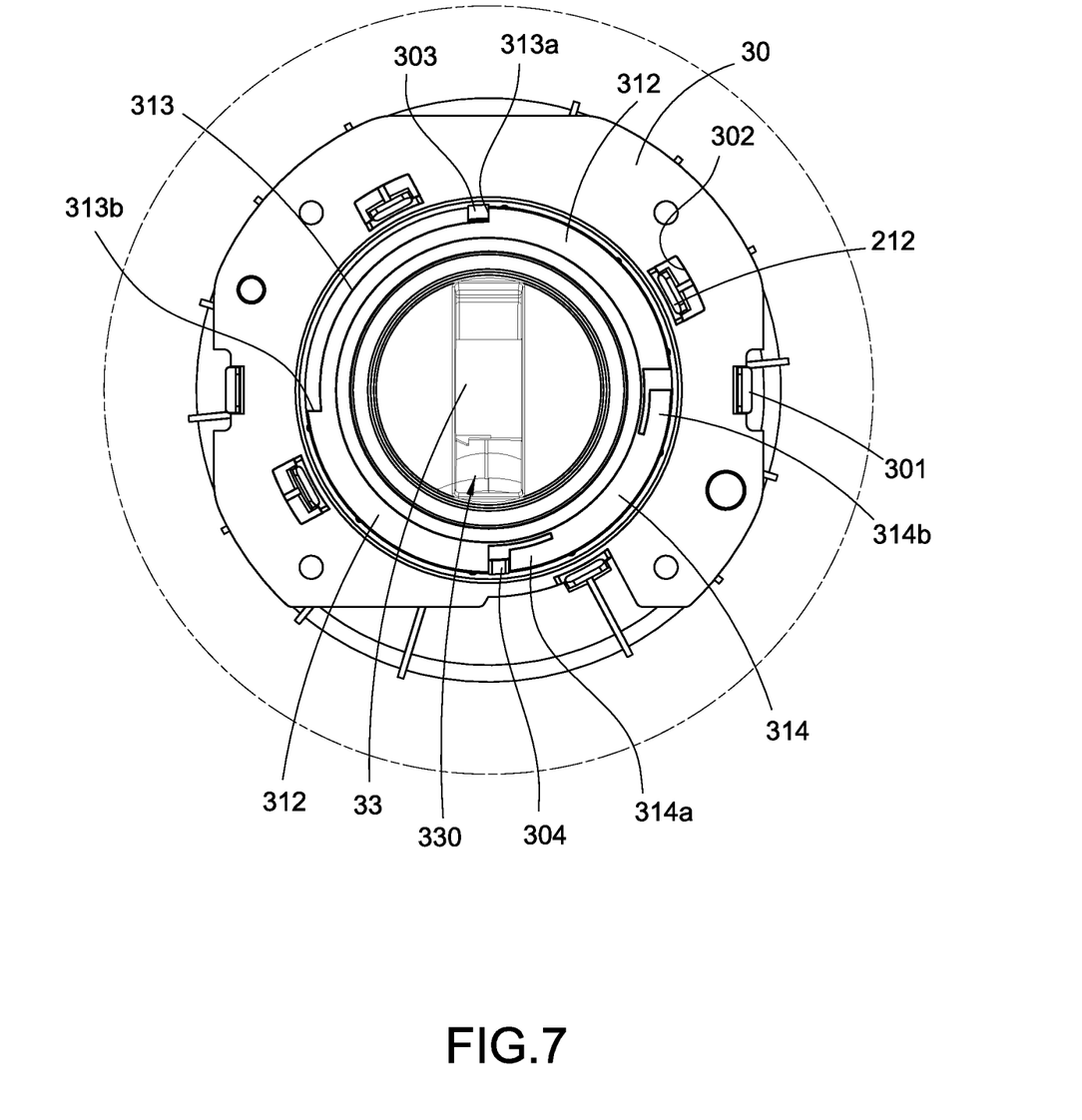
FIG. 7 is a schematic view showing a frontward rotation of the inner structure of the pressure hinge assembly according to the present disclosure.
Figure 8:
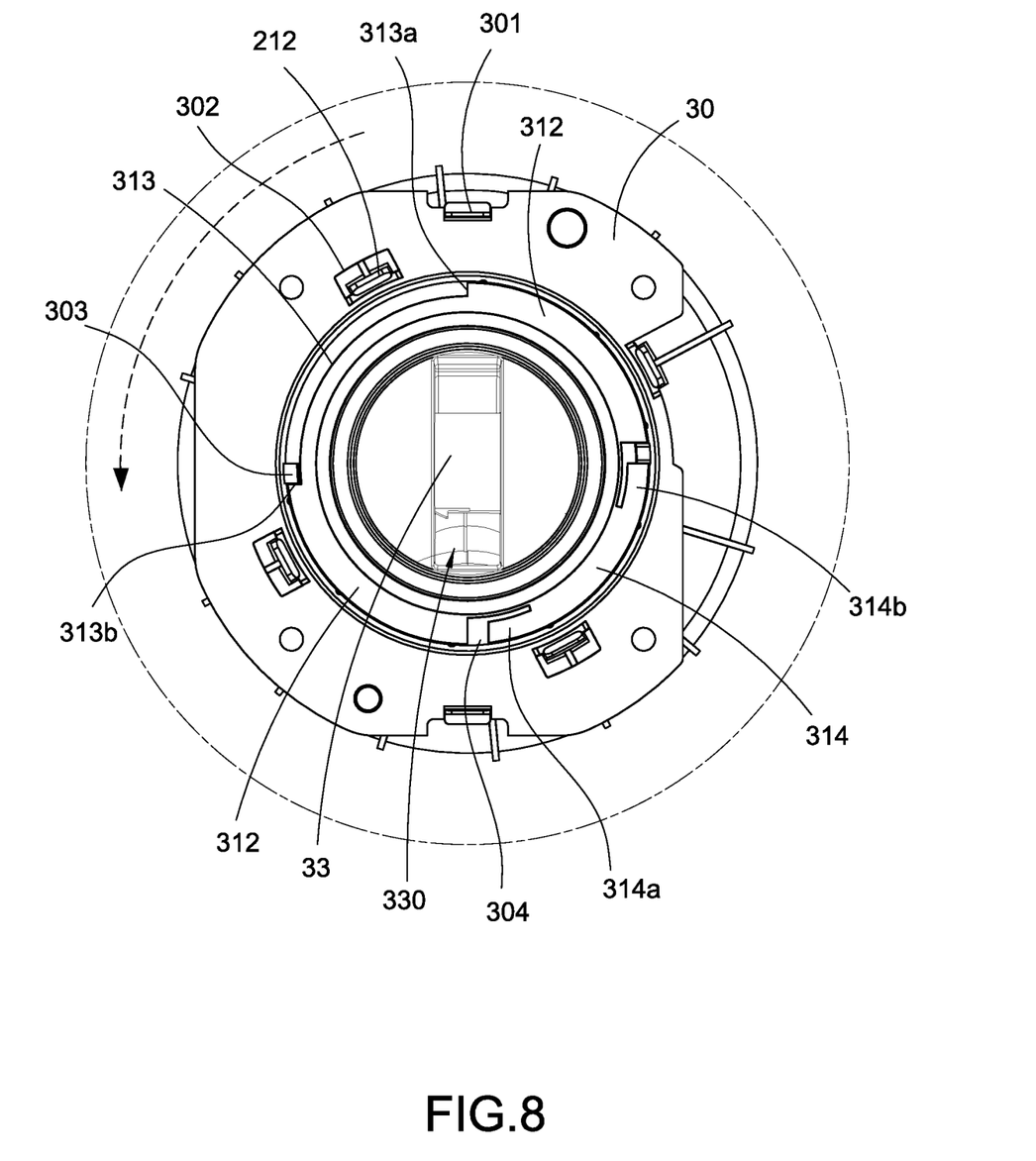
FIG. 8 is a schematic view showing a backward rotation of the inner structure of the pressure hinge assembly according to the present disclosure.

Accordingly, in order to adjust and achieve further position function, an elastic position piece 314 is arranged on the pivoting portion 33 of the pressure hinge assembly 3 in each moving area 313. A gap is formed between the elastic position piece 314 and the limiting ring 312, when the mirroring display panel 2 is rotated, either a first elastic end 314a or a second elastic end 314b on two ends of the elastic position piece 314 is moved across a blocker 304 on the pivoting seat 30. When the rotating mirroring display panel 2 is stopped, the blocker 304 is moved into the gap between the elastic position piece 314 and the limiting ring 312, so that the mirroring display panel 2 is rotated and positioned.

Accordingly, the pressure pivoting electronic mirroring device of the present disclosure could be implemented via aforementioned structures.

In conclusion, the present disclosure achieves the predetermined purpose, solves exist issues, and it is novel, inventive and able to be applied in industry. The present disclosure meets requirement of patentability. In order to protect right of the applicant, the applicant filed an application according to the patent law, and the applicant respectfully requests for consideration and looks forward to be grant.

Although the present disclosure has been described with reference to the foregoing preferred embodiment, it will be understood that the disclosure is not limited to the details thereof. Various equivalent variations and modifications can still occur to those skilled in this art in view of the teachings of the present disclosure. Thus, all such variations and equivalent modifications are also embraced within the scope of the present disclosure as defined in the appended claims.

What is claimed is:

1. A pressure pivoting electronic mirroring device, comprising:
   a supporting unit;
   a mirroring display panel accommodating a cable therein, and the cable being extended into the supporting unit; and
   a pressure hinge assembly comprising a pivoting seat arranged on a back surface of the mirroring display panel, a supporting portion in the mirroring display panel, a fastener attached on the supporting portion, and a pivoting portion pivoted with the pivoting seat and arranged protruding on the back surface of the mirroring display panel to connected to the supporting unit, and a cabling space allowing the cable to inset therethrough being defined in the pivoting portion,
   wherein the pivoting portion is disposed inside the mirroring display panel and protruding out the back surface of the mirroring display panel; and
   wherein the fastener is fastened on the supporting portion when the pivoting portion and the pivoting seat are relatively pivoted.

2. The pressure pivoting electronic mirroring device according to claim 1, wherein the supporting unit comprises a base and a supporting rod arranged upright on the base.

3. The pressure pivoting electronic mirroring device according to claim 2, wherein a pivoting shaft is arranged on the supporting rod, and the pivoting shaft is pivoted with the pivoting portion.

4. The pressure pivoting electronic mirroring device according to claim 3, wherein an axial hole is defined on the pivoting portion and the pivoting shaft is pivoted to the axial hole.

5. The pressure pivoting electronic mirroring device according to claim 4, wherein a fixing portion for positioning the pivoting seat assembled thereinto is formed on the back surface of the mirroring display panel, a through hole is defined on the fixing portion, a pivoting hole is defined on the pivoting seat, and the pivoting portion is pivoted into the pivoting hole.

6. The pressure pivoting electronic mirroring device according to claim 1, wherein handling arms snapped on the supporting portion are arranged on the pivoting seat.

7. The pressure pivoting electronic mirroring device according to claim 1, wherein the pivoting seat is one piece formed in the mirroring display panel corresponding to the back surface.

8. The pressure pivoting electronic mirroring device according to claim 1, wherein at least two limiting rings are arranged on a peripheral edge of the pivoting portion of the pressure hinge assembly, a protruding structure is arranged on each of the two limiting rings corresponding to the pivoting seat.

9. The pressure pivoting electronic mirroring device according to claim 1, wherein at least two limiting rings are arranged on a peripheral edge of the pivoting portion of the pressure hinge assembly, each of the two limiting rings is notched on a peripheral edge thereof to form a moving area, a limiting block is arranged on the pivoting seat and located in the moving area, and the pivoting seat and the pivoting portion are thereby relatively pivotable.

10. The pressure pivoting electronic mirroring device according to claim 9, wherein an elastic position piece is arranged on the pivoting portion according to any of the moving area, a gap is defined between the elastic position piece and the limiting ring, and a blocker movable along the elastic position piece and in the gap is arranged on the pivoting seat.

11. The pressure pivoting electronic mirroring device according to claim 1, wherein a displaying module is arranged in the mirroring display panel and an image photographed by a camera is displayed on the displaying module.

12. The pressure pivoting electronic mirroring device according to claim 1, wherein a displaying module is arranged in the mirroring display panel and a picture-in-picture or a picture-of-picture is displayed on the displaying module.

* * * * *